United States Patent
Tzeng

[19]

[11] Patent Number: 5,934,974
[45] Date of Patent: Aug. 10, 1999

[54] IN-SITU MONITORING OF POLISHING PAD WEAR

[75] Inventor: Huey-Ming Tzeng, San Jose, Calif.

[73] Assignee: Aplex Group, Sunnyvale, Calif.

[21] Appl. No.: 08/964,772

[22] Filed: Nov. 5, 1997

[51] Int. Cl.⁶ .................................................. B24B 49/00
[52] U.S. Cl. .................... 451/6; 451/5; 451/307
[58] Field of Search ................................ 451/6, 21, 307, 451/5

[56] References Cited

U.S. PATENT DOCUMENTS

| | | | |
|---|---|---|---|
| 5,558,568 | 9/1996 | Talieh et al. . | |
| 5,593,344 | 1/1997 | Weldon et al. . | |
| 5,738,562 | 4/1998 | Doan et al. | 451/5 |
| 5,762,536 | 6/1998 | Pant et al. | 451/6 |
| 5,787,595 | 8/1998 | Desai et al. | 33/533 |
| 5,791,969 | 8/1998 | Lund | 451/5 |

*Primary Examiner*—David A. Scherbel
*Assistant Examiner*—Dung Van Nguyen
*Attorney, Agent, or Firm*—Skjerven, Morrill, MacPherson, Franklin & Friel LLP; David T. Millers

[57] ABSTRACT

An in-situ sensor measures polishing pads during chemical mechanical polishing. From the measurements, polishing pads can be identified as worn out or unevenly worn and replaced. Scheduling maintenance according to current measurements, rather than according to statistical predictions, minimizes down time for maintenance and still prevents use of worn out or unevenly worn polishing pads. Alternatively, a tool is reconfigured according to the polishing pad measurements. Reconfiguring the tool can prolong pad life and improve polishing performance. One embodiment of the invention includes a non-contact sensor such as a laser sensor that directs an incident beam at a target area and determines a distance to a reflection point by triangulation of incident and reflected beams. As polishing pads wear, distances to the reflection points increase. Movement of the polishing pads and the sensor during polishing causes the in-situ sensor to measure portions of the polishing pads that are along a zigzag trajectory. When the frequency of the sensor's motion is a multiple of the frequency of revolution of the polishing pads, the sensor retraces the same trajectory after one or more revolutions of the polishing pads. Thus, pad thickness or wear at the same set of points can be compared from one tracing of the trajectory to the next.

31 Claims, 3 Drawing Sheets

IN-SITU MONITORING OF POLISHING PAD WEAR

BACKGROUND

1. Field of the Invention

The invention relates to semiconductor wafer processing and to systems and methods that measure wear on polishing pads used in chemical mechanical polishing.

2. Description of Related Art

Chemical mechanical polishing (CMP) uses a chemical reactant in a polish or slurry and the mechanical action of a polishing pad to planarize a wafer. The polishing removes material from the surface of the wafer but also wears away the polishing pad. Eventually, the polishing pads must be replaced because the pads have worn out or worn unevenly. Unevenly worn pads can cause uneven removal of material from a wafer and may result in a poorly polished surface. Accordingly, for efficient operation of a CMP system, polishing pads must be regularly checked for wear and/or replaced. Detaching a pad to measure pad thickness is impractical because pads are typically attached with an adhesive that would tear and make the pad unusable. Optical measurement of an attached pad is possible, but a non-uniform distribution of water and slurry on the pad prevents optical interferometry as a viable technique for thickness measurements unless the system is stopped and the pads are cleaned and dried.

A concern in current CMP systems is proper scheduling of maintenance of the polishing pads. Due to the difficulties in accurately measuring polishing pads, a current practice is to replace pads after polishing a set number of wafers. However, the number of wafers that can be polished before pad replacement is required may vary because the properties of the pad material can vary from lot to lot and different wafers and polishing parameters cause pads to exhibit a wide range of wear rates. Replacing polishing pads too often increases down time for the CMP system and reduces the maximum yield of polished wafers. A CMP system is desired that minimizes down time for polishing pad maintenance but still avoids problems associated with worn out or unevenly worn polishing pads.

SUMMARY

In accordance with the invention, an in-situ sensor in a chemical mechanical polishing (CMP) system measures polishing pads. During polishing, an analyzer or system controller in the CMP system determines from the in-situ sensor measurements whether polishing pads are worn out or unevenly worn and signals the systems user when pad maintenance is required. Polishing is only interrupted for maintenance when the CMP system requires pad replacement. Thus, down time for polishing pad maintenance is minimized. Additionally based on the measurements of the pads, the system controller can adjust operating parameters of the CMP system, as required to improve system performance or cause the pads to wear more evenly.

One embodiment of the invention includes a non-contact sensor such as a laser sensor that directs an incident beam at a target area, senses a reflected beam, and determines a distance to a reflection point by triangulation of incident and reflected beams. The target area for the sensor is ideally located where the polishing pad has a consistent position in each revolution. For example, the target area may overlie a roller or pulley on which a belt for the polishing pad rides. Distances are measured to points in depressions and points on lands of the polishing pads as the depressions or lands move into the sensor's target area. As polishing pads wear, distances to the reflection points on lands increase, but distances to bottoms of depressions remain approximately constant. The difference between an average distance to points on a land and an average distance to points in a depression indicates the thickness of the land. A root means square variation of the distances to a land indicates the variation in the land thickness, i.e., the surface roughness.

During a CMP operation, the sensor measures points on the polishing pads that are along a measurement trajectory. The measurement trajectory depends on movement of the sensor and the movement of the pads. In one embodiment of the invention, a component of the sensor's velocity is perpendicular to the direction of motion of the polishing pads. For example, a back and forth motion of the sensor creates a zigzag trajectory that crosses the polishing pad. If the frequency of the back and forth motion is an integer multiple of the frequency of revolution of the polishing pad, the sensor retraces the same trajectory after one or more revolutions of the polishing pad. Thus, pad thickness or wear at the same set of points can be compared from one tracing of the trajectory to the next to identify wear.

As a further aspect of the invention, a CMP tool is operated according to the measurements of the polishing pad. For example, operating parameters of the CMP tool can be adjusted to compensate for uneven wearing of the polishing pad. Such adjustments may also improve uniformity of polishing. Further, the timing of polishing pad maintenance is selected according to current actual polishing pad thicknesses and profiles rather than according to statistical predictions which could be in error for a particular polishing pad.

One embodiment of the invention is a polishing tool including: a polishing pad movably mounted for revolution during polishing; a sensor mounted to measure distances to portions of the polishing pad that move into a target area of the sensor while the polishing pad revolves; and a controller coupled to the sensor, wherein the controller determines from the measured distances whether the polishing pad requires maintenance.

BRIEF DESCRIPTION OF THE DRAWINGS

Use of the same reference symbols in different figures indicates similar or identical items.

DETAILED DESCRIPTION OF THE PREFERRED EMBODIMENTS

In accordance with an aspect of the invention, a non-contacting, in-situ sensor measures distance to a surface of a moving polishing pad during chemical mechanical polishing (CMP). As the polishing pad wears and therefore thins, measured distances to the polishing pad increase. Accordingly, from the measured distances, a system controller can determine when a polishing pad is unevenly worn or too thin and must be replaced. Additionally, during a CMP process, the controller can detect differences in the wearing at the different points and identify uneven wear that requires changes in the operating parameters such as the dwell time or the pressure of the conditioner. The changes in the operating parameters of the system can improve pad life and polishing performance.

Figure 1:
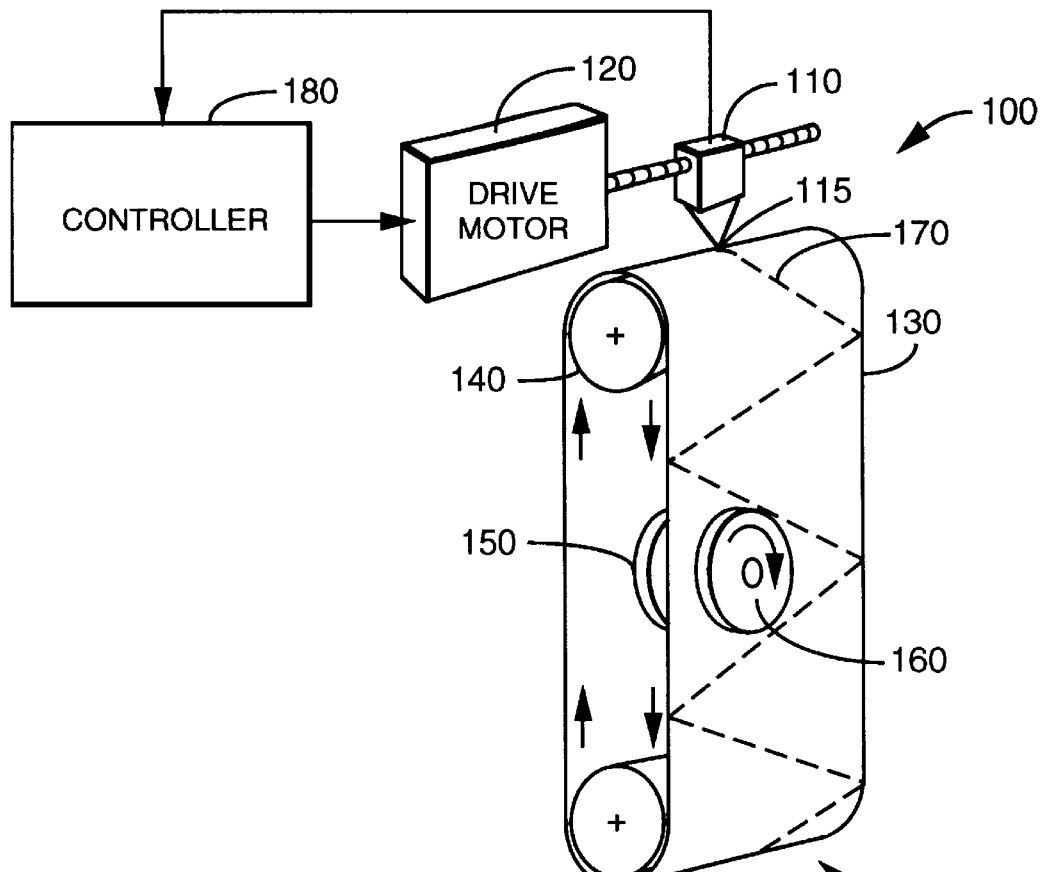
FIG. 1 shows a portion of a chemical mechanical polishing system that in accordance with an embodiment of the invention has an in-situ sensor for measuring a polishing pad.

FIG. 1 shows a portion of a CMP tool 100 in accordance with an embodiment of the invention. CMP tool 100 includes a belt 130 carrying polishing pads, a wafer carrier head 160 that positions a wafer against the polishing pads, a support bearing 150 that supports belt 130 under wafer carrier head 160, a belt drive system including rollers 140 to move belt 130 and the polishing pads, and a sensor 110 mounted on a sensor drive system to measure a distance to the polishing pads. In operation, the belt drive system rotates belt 130 so that the polishing pads slide past an exposed surface of a wafer mounted on wafer carrier head 160. Support 150 and wafer carrier head 160 co-operate to keep the polishing pads parallel to and uniformly in contact with the surface of the wafer. Co-filed U.S. patent application Ser. No. 08/965,033, entitled "Wafer Carrier Head with Attack Angle Control for Chemical Mechanical Polishing," describes a wafer carrier head and is hereby incorporated by reference herein in their entirety. Co-filed U.S. patent application Ser. No. 08/964,773, entitled "Chemical Mechanical Polishing System including a Hydrostatic Fluid Bearing Support", and co-filed U.S. patent application Ser. No. 08/964,774, entitled "Polishing Tool Having a Sealed Fluid Chamber for Support of Polishing Pad", describe supports suitable for CMP tool 100 and are hereby incorporated by reference herein in their entirety.

The mechanical action of the polishing pads and a chemical reaction of a reactant in a slurry or polish applied to the polishing pads combine to remove material from the wafer and polish or locally planarize the surface of the wafer. Ideally, the removal of material is preferential to the highest points on the surface of the wafer but otherwise uniform across the area of the wafer. Imperfections in the polishing pads or uneven pressure from support 150 and/or head 160 can make particular regions of the polishing pads more or less efficient at removing material from the wafer. For example, a spot in a polishing pad applied with a lower pressure to a wafer in wafer carrier head 160 would be expected to remove material more slowly than points applied at higher pressure. In CMP tool 100, a carrier head drive system (not shown) rotates wafer carrier head 160 and moves wafer carrier head 160 back and forth across belt 130. This lessens the effect of a polishing pad region having a different polishing rate by spreading the effect of the different polishing rate across a larger area of the wafer.

A controller 180 controls a drive system 120 which moves sensor 110 and processes measurements from sensor 110 during CMP operations. Controller 180 may be, for example, a computer executing appropriate software or a special purpose processing circuit. In an exemplary embodiment of the invention, controller 180 is a personal computer with an interface card for control of drive system 120 and an interface card for data acquisition from sensor 110. Controller 180 identifies uneven or excessive wear of the polishing pads from the acquired measurements of the polishing pads. If uneven wear is detected, controller 180 can change the operating parameters of CMP tool 100 in attempt to compensate. For example, the range of motion of wafer head 160 can be altered to increase the time during which the wafer remains in areas where pad wear is less. A portion of the pad that wears more slowly may indicate that pressure on that portion of the pad is too low, and controller 180 could adjust the configuration of support 150 or wafer head 160 to increase pressure in selected areas. U.S. patent application Ser. No. 08/964,774, entitled "Polishing Tool Having a Sealed Fluid Chamber for Support of Polishing Pad" describes a support having a controlable pressure profile. The rotational velocity of belt 130 or the polishing time can also be changed. Other control methods are possible and depend on the specifics of the CMP tool. When measurements indicate a pad is too thin or too uneven for compensation, analyzer 180 signals that polishing pad maintenance is required.

Sensor drive system 120 moves sensor 110 back and forth over positions where belt 130 and the polishing pads are reliably located from one revolution to the next. For example, sensor 110 can be positioned overlying positions where belt 130 rides in direct contact with roller 140 so that at any instant, the portion of belt 130 in the target area 115 of sensor 110 is against roller 140 and extends toward sensor 110 a distance equal to the combined thickness of belt 130 and the polishing pads. Sensor 110 measures the distance to the surface of the portion of the polishing pads currently in the target area 115. The measurements can be taken during polishing while the pads are moving or between polishing operations while the pads are stationary. Polishing pad thickness or wear is determined from comparisons of measurements as described further below. Generally speaking, as the polishing pads wear and decrease in thickness, sensor 110 measures larger average distances. The polishing pads can thus be identified as worn out from an average distance measurement.

In the exemplary embodiment, drive system 120 moves sensor 110 across the width of belt 130 perpendicular to direction of motion of belt 130. Alternatively, sensor 110 can move along any desired path. For example, sensor 110 can move an angle with the direction of motion of belt 130 so that the motion of sensor 110 relative to belt 130 causes sensor 110 to cross the width of belt 130 and measure a polishing pad's profile perpendicular to the direction of motion. Generally, the distance measurements correspond to portions of the polishing pads that are along a path 170 that depends on the movement of sensor 110 and belt 130. Belt 130 can be stopped at any location to allow measurement of a specific portion of the polishing pads. Alternatively, movement of sensor 110 can be synchronized with the revolution of belt 130 so that sensor 110 periodically retraces the same path and repeats measurements of the same portions of the polishing pads during polishing. For example, if the frequency of back and forth motion of sensor 110 is an integer multiple of the frequency of revolution of belt 130, sensor 110 retraces the same path 170 relative to belt 130 during each revolution of belt 130. If the frequency of back and forth motion of sensor 110 is a half integer or other fractional multiple of the frequency of revolutions of belt 130, a complete tracing of path 170 requires two or more revolutions of belt 130. In such cases, the measurement of the polishing pad thickness at a point on belt 130 during one revolution of belt 130 can be compared with measurements at the same point during subsequent revolutions, and polishing pad wear at the point can be tracked.

Figure 2:
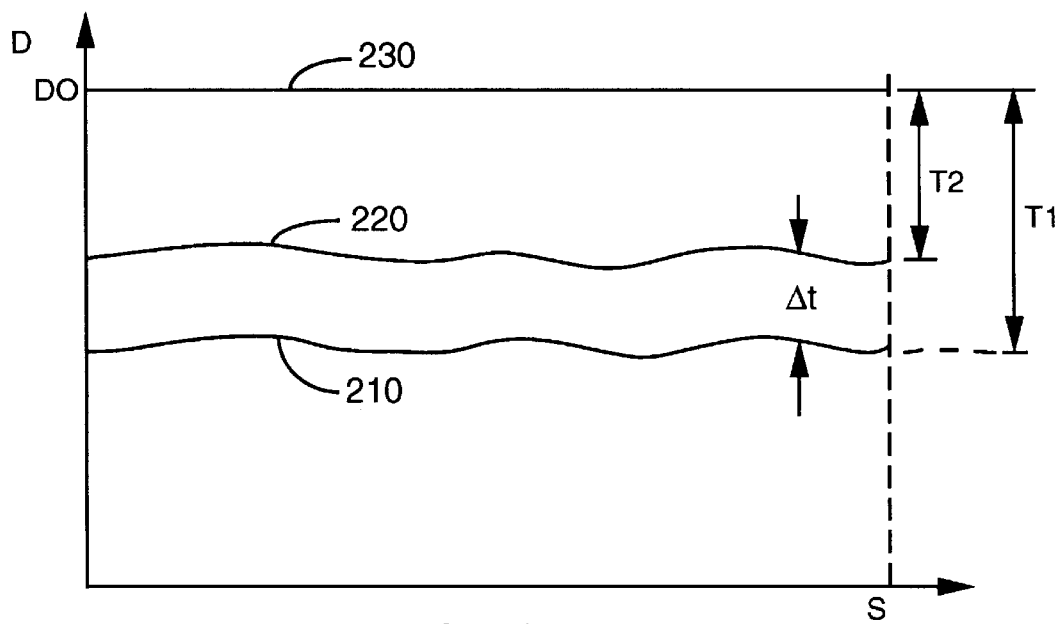
FIG. 2 shows plots of the distance between a sensor and a pad surface along a path on a moving belt in the system of FIG. 1.

FIG. 2 illustrates plots 210 and 220 of measured distances D for points along path 170 during different revolutions of belt 130. Plots 210 and 220 are plotted relative to a time index S that starts at a timing mark indicating a start for path 170. The distance measurements in plots 210 and 220 are not constant because of variations in yhe thickness of the polishing pads along path 170, variation in the height of sensor 110 relative to roller 140 during back and forth motion, or other system imperfections. It is not critical that sensor 110 be positioned at a uniform distance from roller 140 during the entire range of motion of sensor 110 if wearing can be determined from the difference between plots for different revolutions. Plot 220 corresponds to a revolution occurring after the revolution corresponding to plot 210, and the difference between plot 220 and plot 210 indicates an amount of polishing pad wear Δt occurring between the two revolutions. For plots 210 and 220, Δt is nearly constant over the range of time index S indicating uniform wear at least for the portions of the polishing pads along path 170. If polishing pad wear were uneven, the difference between plots 210 to 220 would vary significantly over the range of time index S. Selecting the frequency of motion of sensor 110 so that many revolutions of belt 130 are required before sensor 110 returns to the start of path 170 increases the area of the polishing pad being measured and may improve the ability to detect small regions of uneven wear.

To determine whether a pad is worn out, either the total amount of wear or actual thickness of the polishing pad is determined. One way to determine the total amount of wear determines an initial plot of measured distances such as a plot 230 and saves the initial plot for comparison to subsequent plots such as plot 220 or 210. A difference between the initial plot and a subsequent plot indicates the accumulated pad wear from the initial use until the subsequent plot is measured. If the accumulated wear exceeds a threshold, the pad can be replaced. To make an absolute determination of the thickness of the polishing pads, an initial plot 230 can be determined without polishing pads in place. Using plot 230 as a base line, plots 210 and 220 indicate the thicknesses T1 and T2 of the polishing pads during revolutions corresponding to plots 210 and 220. If a pad becomes too thin, it is replaced.

Figure 3:
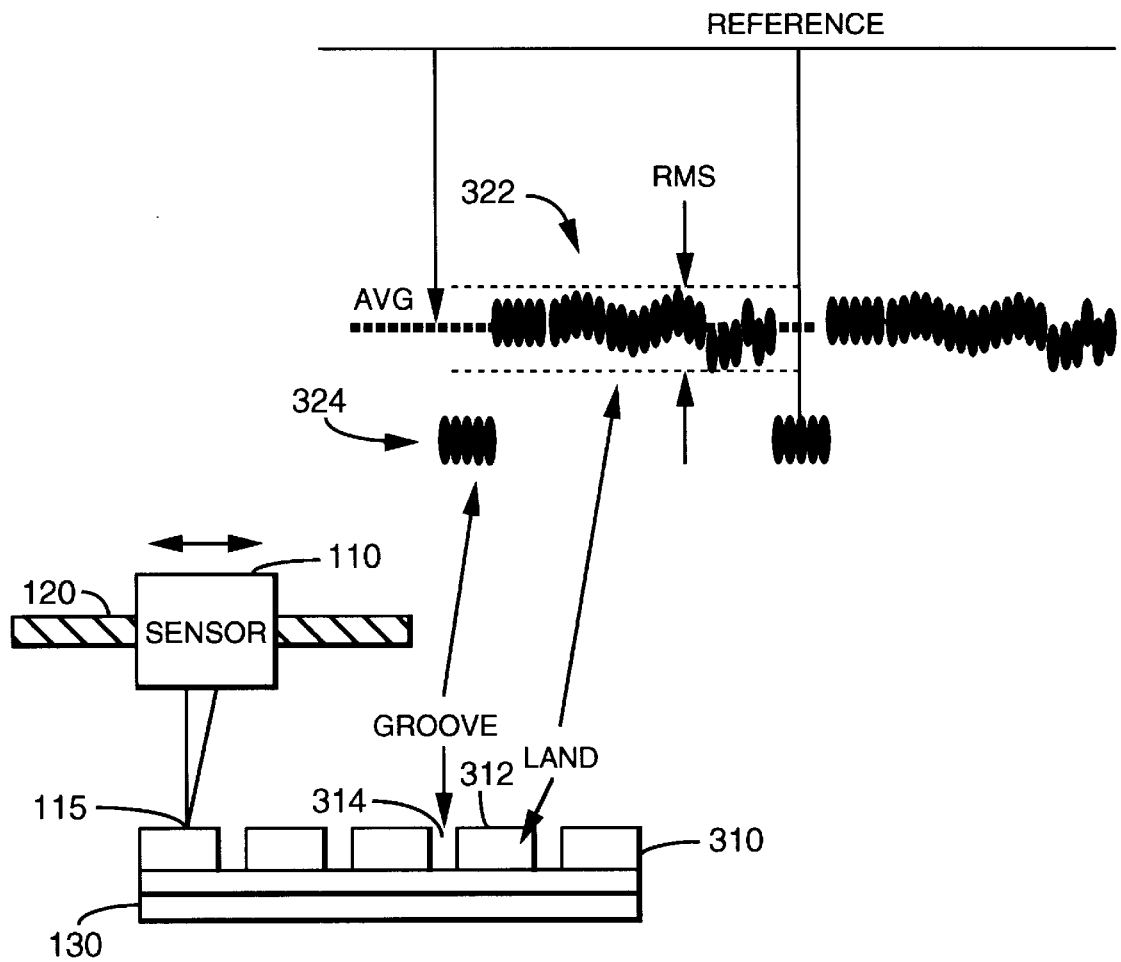
FIG. 3 illustrates measurements of polishing pad depressions and lands in accordance with an embodiment of the invention.

Another way to determine pad thickness is to measure the difference between a point in depression in a polishing pad and a point on a land portion of the polishing pad. Depressions in a polishing pad can take many forms including a groove or hole or perforation through the polishing pad. FIG. 3 illustrates the relation between distance measurements and points on a pad 310. Pad 310 includes depressions 314 that separated a high areas (lands 312). In a typical unworn polishing pad for a CMP tool, the distance from the top of a land 312 to the bottom of a depression 314 is typically about 0.015" to 0.025". Pads are typically replaced when the lands wear down to about 0.0020" to 0.0015" or when accumulated wear has made the surface of the pad too uneven for the desired polishing precision. Sensor 110 while moving across the width of a polishing pad measures distances to a series of about 5 to 10 points in each depression encountered and a larger series of points on each land of the polishing pad. A controller when processing measurements from sensor 110 can identify a transition from a depression to a land or from a land to a depression by an abrupt change in the distance measurements. For example, FIG. 3 shows an abrupt decrease in distance measurement at a transition from a series of measurements 324 corresponding to a depression 314 to a series of measurements 322 corresponding to land 312. Measurements 324 can be averaged for the depression. Such averages statistically provide a more accurate indication of the distance to depression 314 than would a single measurement. Additionally, an average value requires less memory when measurements are stored for later comparisons with measurements during subsequent revolutions of the pads. The average distance to a particular point in a particular depression should remain constant through out the polishing process since wear of the pad in the groove is low. However, the distance to a point in a depression may decrease if material accumulates in the depression. A prior measurement of the depression can identify whether a residue has built up. The difference between the subsequent distance to a depression to an initial distance to the depression indicates the amount of residue build up.

For measurements 322 corresponding to land 312, the controller determines an average distance to the land and a root mean square (RMS) variation. The difference between the average distance to the land and the average distance for a neighboring depression indicates the thickness of the land. The RMS variation quantifies the unevenness of the surface of the land. The unevenness of the polishing surfaces as a whole is determined from the variations in the average distances to the pads and the RMS variations for each pad. Saving the average distance and RMS variation for each land greatly reduces the storage requirements of the system when such values are saved for comparisons with later measurements.

Sensor 110 is selected according to the operating conditions and the precision required in CMP tool 100. In particular, sensor 110 is preferably a non-contact sensor that provides a standoff of about one to two inches from the pad and accurate measurements of distance to a polishing pad without significant loss of accuracy due to slurry on the polishing pad. For typical unworn pad thickness of about 1250 μm, a sensitivity of about 10 μm or better is desired, and a spatial resolution of about 50 μm is needed to measure several points inside a depression in a polishing pad. The response speed required depends on the component of the sensor's velocity perpendicular to the direction of motion of the belt. A response speed of about 1 kHz is typically sufficient. Optical and non-sensors are available for these purposes. Of the optical sensors, interferometry based sensors are typically unsuitable because slurry on the pads disturbs distance measurements. In the exemplary embodiment, sensor 110 is a laser sensor that directs a light beam at a target area, senses a reflected beam, and uses triangulation to determine the distance to a point of reflection. A suitable optical sensor for this application is a LM10 microlaser sensor available from Aromat, Inc. An alternative optical sensor employs a confocal technique that determines a distance to a point from the lens configuration when focused on the point. Possible non-optical sensors include a hot wire sensor that determines distance to a surface from the effect that the surface has on heat conduction from a hot wire or resistor.

Figure 4:
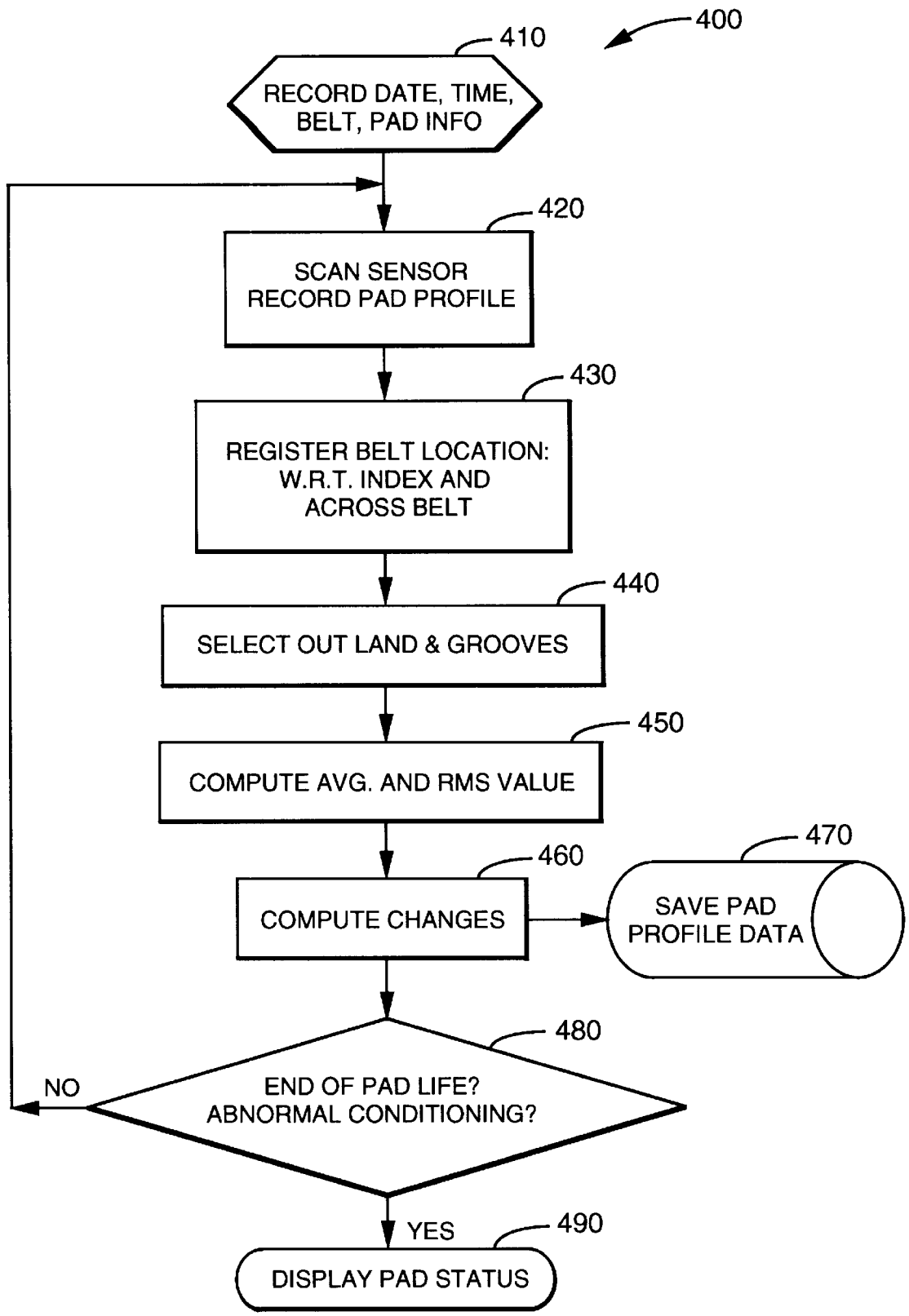
FIG. 4 shows a flow diagram of data acquisition process for measurement of a polishing pad in accordance with an embodiment of the invention.

FIG. 4 illustrates a data acquisition and analysis process 400 for a CMP system in accordance with an embodiment of the invention. At the start of a polishing operation, an initial step 410 records information such as the date, time, and belt or pad identification to identify the CMP operation. Process 400 then enters a processing loop including steps 420, 430, 440, 450, 460, 470, and 480 which are repeated until the CMP operation is complete or step 480 determines that the pad requires maintenance. In the processing loop, step 420 measures distances to points in a section of the polishing pad. The section is preferably relatively short to minimize the number of points processed at a time. A path crossing about three grooves in the pad is a suitable section for processing during an interation of the processing loop. Step 430 identifies and records a position for the measured section of the belt. The section's position circumferentially around the belt can be identified from a time or angular revolution of belt 130 since a last encountering of an index point on the belt. The position of sensor 110 identifies the section's position perpendicular to the direction of motion of the polishing pad.

Steps 440, 450, and 460 analyze the measurements. Step 440 identifies series of measurements that correspond to grooves and series of measurements that correspond to lands in the section. Step 450 determines an average distance and an RMS variation for each series identified. Step 460 compares the average distances and RMS values to each other and to previously saved values for the same section of the polishing pad. Example comparisons include calculating a difference between average distance for a land and neighboring grooves to determine pad thickness at the land and determining variations in thickness across an area of the polishing pad. Step 470 saves the determined averages and RMS variations with the identifying information for the section. If the polishing pad is not at the end of its life and not abnormally worn, the processing loop is repeated for the next section of the polishing pad. If the pad is worn out or abnormally worn, step 480 directs process 400 to a step 490 that displays the status of the polishing pad. A user of the CMP tool can then initiate maintenance of the polishing pad.

Run-to-run control processes and trend analysis can use the pad measurements saved over several different polishing operations to identify pad conditions that affect polishing uniformity or material removal rates. In particular, statistical analysis of the pad measurements can establish upper and lower bounds for pad parameters in a properly functioning CMP system. If those statistical bounds are exceeded, a user is alerted to the possibility that polishing performance is less than optimal. The user can then take corrective actions such as changing polishing parameters or replacing pad. Conversely, if polishing performance is less than optimal, comparisons of the pad measurements to the statistical bounds can indicate or eliminate the pad as a likely source of the problem.

Although the invention has been described with reference to particular embodiments, the description is only an example of the invention's application and should not be taken as a limitation. In particular, although embodiments of the invention have been described as applied in CMP belt polishers, other embodiments of the invention can be employed in other polishers such as purely mechanical polishers and turntable polishers. In such embodiments, polishing pads can be measured in the polisher while the pads are at rest or in use for polishing. Various other adaptations and combinations of features of the embodiments disclosed are within the scope of the invention as defined by the following claims.

I claim:

1. A polishing tool comprising:
   a polishing pad movably mounted for revolution during polishing;
   a sensor mounted to measure distances to portions of the polishing pad in a target area of the sensor while the polishing pad is mounted in the polishing tool and revolving; and
   an analyzer coupled to the sensor, wherein the analyzer determines a thickness of the polishing pad from the measured distances.

2. The polishing tool of claim 1, wherein the sensor is mounted to measure distances to portions of the polishing pad that move into the target area of the sensor while the polishing pad revolves during polishing of an object.

3. The polishing tool of claim 1, further comprising:
   a belt on which the polishing pad is mounted; and
   a drive system that causes the belt and polishing pad to revolve.

4. The polishing tool of claim 3, wherein the drive system comprises a roller on which the belt rides, and the target area of the sensor includes a portion of the belt that is on the roller.

5. The polishing tool of claim 1, further comprising a sensor drive system on which the sensor is mounted, wherein the sensor drive system moves the sensor across the polishing pad while the polishing pad is revolving.

6. The polishing tool of claim 5, wherein the sensor drive system moves the sensor back and forth along a line perpendicular to a direction of motion of the polishing pad.

7. The polishing tool of claim 1, wherein the sensor measures the distances without contacting the polishing pad.

8. The polishing tool of claim 7, wherein the sensor comprises an optical sensor.

9. The polishing tool of claim 8, wherein the optical sensor measures the distances by triangulation.

10. The polishing tool of claim 8, wherein the optical sensor measures the distances using a confocal technique.

11. The polishing tool of claim 1, wherein the polishing tool performs mechanical polishing of a wafer.

12. The polishing tool of claim 1, wherein the analyzer determines from the measured distance whether the polishing pad requires replacement or repair.

13. The polishing tool of claim 1, wherein the analyzer determines whether adjustment of operating parameters of the polishing tool is required.

14. The polishing tool of claim 13, wherein the analyzer adjusts the operating parameters of the polishing tool according to results of analyzing the measured distances.

15. A method for operating a polishing tool, comprising:
   polishing an object using a moving polishing pad mounted on the polishing tool;
   measuring distances to portions of the polishing pad while the polishing pad is on the polishing tool and moving; and
   determining from measurements of the polishing pad taken while the polishing pad is mounted on the polishing tool whether the polishing pad requires maintenance.

16. The method of claim 15, wherein measuring distances to portions of the polishing pad comprises using an optical sensor to measure a distance from the optical sensor to a surface of the polishing pad.

17. The method of claim 15, wherein:
   measuring distances to portions of the polishing pad comprises:
      measuring, during a first revolution of the polishing pad, a first distance to a point on a surface of the polishing pad; and
      measuring, during a second revolution of the polishing pad, a second distance to the point on the surface of the polishing pad; and
   determining whether the polishing pad requires maintenance comprises determining a difference between the first and second distances to determine an amount of wearing of the polishing pad between the first and second revolutions.

18. The method of claim 15, wherein measuring distances to portions of the polishing pad comprises:

measuring a first distance to a first point in a depression on the polishing pad;

measuring a second distance to a first point on a land of the polishing pad; and using a difference between the first and second distances in determining a thickness of the land.

19. The method of claim 15, wherein measuring distances to portions of the polishing pad comprises:

moving a sensor with a velocity having a component perpendicular to a direction of motion of the polishing pad during polishing; and measuring the polishing pad during polishing while both the polishing pad and the sensor are moving.

20. The method of claim 19, wherein moving the sensor moves the sensor back and forth over a width of the polishing pad.

21. The method of claim 20, wherein during polishing:

the polishing pad revolves at a first frequency; and the sensor moves back and forth at a second frequency that is an integer multiple of the first frequency.

22. The method of claim 15, wherein measuring the polishing pad comprises determining polishing pad thickness.

23. The method of claim 15, wherein measuring the polishing pad comprises determining polishing pad wear.

24. The method of claim 15, wherein measuring the polishing pad comprises determining polishing pad surface roughness.

25. The method of claim 15, wherein measuring the polishing pad comprises measuring an amount of residue build-up in a depression in the polishing pad.

26. A method for operating a polishing tool, comprising:

polishing an object using a moving polishing pad mounted on the polishing tool;

measuring the polishing pad while the pad is mounted on the polishing tool, wherein measuring the polishing pad comprises:

measuring distances to a series of points in a section of the polishing pad, the section including a depression and a land;

identifying a first set containing measured distances that correspond to points in the depression and a second set containing measured distances that correspond to the land;

determining a first average distance that is an average of the distances in the first set and a second average distance that is an average of the distances in the second set; and using a difference between the first and second average distances in determining a thickness of the land; and determining from measurements of the polishing pad taken while the pad is mounted on the polishing tool whether the polishing pad requires maintenance.

27. The method of claim 26, further comprising:

determining a variation of the distances in the second set;

storing the second average distance and the variation in a memory; and comparing subsequent measurements of the polishing pads to the average distance and variation stored in the memory.

28. A method for operating a polishing tool, comprising:

polishing a wafer using a moving polishing pad;

measuring the polishing pad wear during polishing while the polishing pad is in the polishing tool;

analyzing measurements of the polishing pad wear taken while the polishing pad is in the tool; and adjusting operating parameters of the polishing tool according to results generated in the analyzing step.

29. The method of claim 28, wherein adjusting operating parameters comprises altering a pattern of motion of the wafer relative to the polishing pad.

30. The method of claim 28, wherein measuring the polishing pad wear comprises using an optical sensor to measure a distance from the optical sensor to a surface of the polishing pad.

31. The method of claim 28, wherein the measuring, analyzing, and adjusting occur simultaneously with polishing.

* * * * *